(12) United States Patent
Tanaka et al.

(10) Patent No.: US 7,422,919 B2
(45) Date of Patent: Sep. 9, 2008

(54) AVALANCHE PHOTODIODE

(75) Inventors: Shigehisa Tanaka, Kunitachi (JP);
Sumiko Fujisaki, Hachioji (JP);
Yasunobu Matsuoka, Hachoiji (JP)

(73) Assignees: Hitachi, Ltd., Tokyo (JP); Opnext Japan, Inc., Kanagawa (JP)

( * ) Notice: Subject to any disclaimer, the term of this patent is extended or adjusted under 35 U.S.C. 154(b) by 376 days.

(21) Appl. No.: 11/320,750

(22) Filed: Dec. 30, 2005

(65) Prior Publication Data
US 2006/0110841 A1 May 25, 2006

Related U.S. Application Data

(63) Continuation of application No. 10/763,269, filed on Jan. 26, 2004, now abandoned.

(30) Foreign Application Priority Data
Jul. 9, 2003 (JP) .............................. 2003-194005

(51) Int. Cl.
*H01L 21/00* (2006.01)

(52) U.S. Cl. .............................. 438/48; 438/24; 438/46; 438/149; 257/E31.058

(58) Field of Classification Search ................... 438/24, 438/46, 48, 149
See application file for complete search history.

(56) References Cited

U.S. PATENT DOCUMENTS

| 5,233,209 | A | 8/1993 | Rodgers et al. |
| 5,650,635 | A | 7/1997 | Razeghi et al. |
| 6,384,462 | B1 | 5/2002 | Pauchard et al. |
| 6,794,631 | B2 | 9/2004 | Clark |
| 2001/0035540 | A1* | 11/2001 | Sugiyama et al. ........... 257/226 |
| 2002/0117697 | A1* | 8/2002 | Tanaka et al. .............. 257/288 |

FOREIGN PATENT DOCUMENTS

| JP | 02-005489 | 6/1988 |
| JP | 2000-174325 | 12/1999 |
| JP | 2001-313415 | 4/2000 |
| JP | 2002-170983 | 11/2000 |
| JP | 2002-324911 | 6/2001 |

* cited by examiner

*Primary Examiner*—Wai-Sing Louie
(74) *Attorney, Agent, or Firm*—Reed Smith LLP; Stanley P. Fisher, Esq.; Juan Carlos A. Marquez, Esq.

(57) ABSTRACT

An avalanche photodiode includes at least one crystal layer having a larger band-gap than that of an absorption layer formed by a composition or material different from that of the absorption layer formed on a junction interface between a compound semiconductor absorbing an optical signal and an Si multiplication layer, and the crystal layer may be intentionally doped with n or p type impurities to cancel electrical influences of the impurities containing oxides present on the junction interface of compound semiconductor and surface of Si.

5 Claims, 7 Drawing Sheets

FABRICATION PROCESS
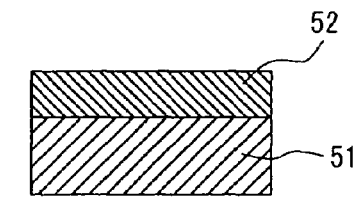
FIG.5A
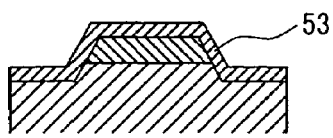
FIG.5B
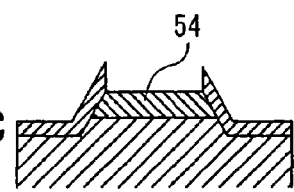
FIG.5C
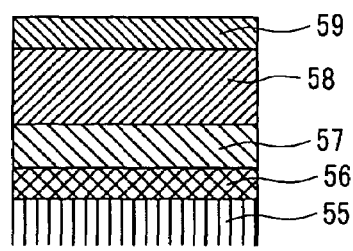
FIG.5D
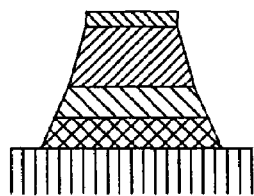
FIG.5E
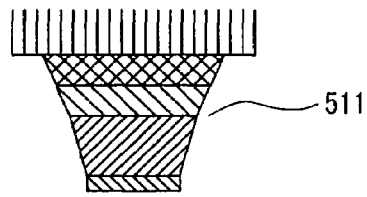
FIG.5F
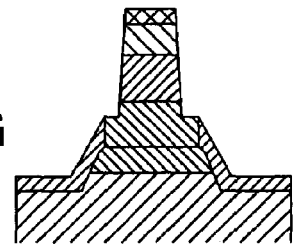
FIG.5G
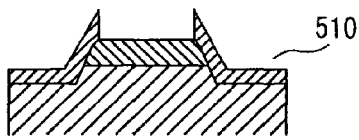
FIG.5H (upper part, label 510)
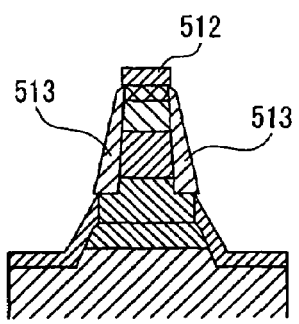
FIG.5H
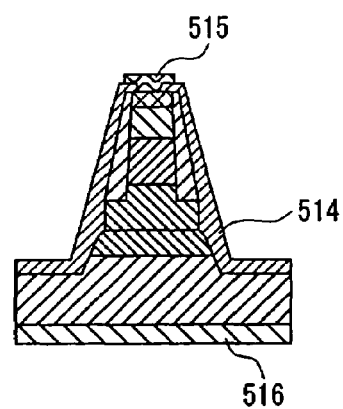
FIG.5I

OPTICAL SIGNAL

AVALANCHE PHOTODIODE

CROSS-REFERENCE TO RELATED APPLICATION

This application is a Continuation of U.S. application Ser. No. 10/763,269 filed on Jan. 26, 2004, now abandoned and claims priority from U.S. application Ser. No. 10/763,269 filed on Jan. 26, 2004 which claims priority from Japanese Patent Application NO. 2003-194005, filed on Jul. 9, 2003, the entire disclosures of which are incorporated herein by reference.

BACKGROUND OF THE INVENTION

1. Field of the Invention

The present invention relates to an avalanche photodiode and more particularly to a fast, highly sensitive, wideband avalanche photodiode with a large gain for use in optical communication.

2. Description of the Related Art

The avalanche photodiode is a light receiving device with a built-in function of amplifying an optical signal and, because of its high sensitivity and fast operation, has found a wide range of applications as an optical communication light receiving device. The amplification function of the avalanche photodiode is realized by taking advantage of an avalanche breakdown phenomenon that occurs in semiconductors. A principle by which an amplification occurs during the avalanche breakdown is briefly explained as follows.

Electrons or holes moving in a semiconductor are scattered by a crystal lattice when they strike it. Applying a large electric field to the semiconductor accelerates these carriers, resulting in an increase in their moving speed. As the moving speed of the carriers in the semiconductor increases and their kinetic energy is higher than a bandgap of the semiconductor, a probability of breaking bonds of lattice increases when they hit the crystal lattice, newly creating free-moving electron-hole pairs. An atom with its bonds broken loses electric charges and looks as if it is ionized. This phenomenon is therefore called an impact electrolytic dissociation or impact ionization, and a measure of how many electron-hole pairs are generated by the impact ionization after an electron or hole has traveled a unit distance is also called an ionization rate. A ratio of an ionization rate based on electrons to an ionization rate based on holes is further called an ionization rate ratio.

Newly created carriers (electrons or holes) produced by the impact ionization are also accelerated by the electric field and acquire a kinetic energy, with subsequent impact ionizations further creating new carriers. As the impact ionization repetitively occurs, the number of carriers increases rapidly, creating a large current. This is the phenomenon called an avalanche breakdown. In a semiconductor that is applied an electric field of a magnitude just below the avalanche breakdown, an injection of carriers, even in a small number, can produce a large number of new carriers through the impact ionizations, resulting in a sudden increase in current. That is, a large current can be obtained even with an injection of a small number of carriers. This is a principle by which amplification is accomplished during the avalanche breakdown. The avalanche photodiode uses photo-induced carriers produced by an optical absorption for the carrier injection that triggers this phenomenon.

As well known, an important factor in terms of a high-speed response of the avalanche photodiode is the ionization rate ratio. The more the ionization rate ratio is away from unity, the better the performance of the avalanche photodiode becomes. Conversely, as the ionization rate ratio approaches unity, the amplification rate at high speed deteriorates, making it impossible to produce an avalanche photodiode with a good performance. Since infrared light is used in a high-speed optical communication, the fabrication of the light receiving device has so far used compound semiconductors, such as InP and InGaAs. However, the ionization rate ratio of InP, a typical compound semiconductor used in optical communication, is 0.5, relatively close to unity. Even with InAlAs the ionization rate ratio is 4 or 5 at most. Thus, an applicable frequency is about 10 GHz at most. As a result, a satisfactory performance cannot be obtained for high-speed devices of 40 GHz or higher.

On the other hand, Si has a very large ionization rate ratio ranging from 10 to more than 100 and thus can make a fast, highly sensitive avalanche photodiode. However, since Si cannot absorb light in an infrared frequency range used for optical communication, Si has not been able to be used for optical communication.

To overcome this drawback of the Si avalanche photodiode, an attempt has been made to combine Si with a compound semiconductor that has a sensitivity in the infrared range. For example, epitaxially growing a compound semiconductor on Si has been explored for a couple of decades now. However, no crystal with a satisfactory quality has been realized for practical use.

An example method for alleviating this quality problem of such a compound semiconductor on Si is disclosed in U.S. Pat. No. 6,384,462B1, which is briefly explained with reference to FIG. 2. In this patent, an avalanche photodiode is formed by directly fusing a Si multiplication layer 23 onto an InGaAs layer 22 epitaxially grown on a compound semiconductor substrate 21, as shown in FIG. 2. Further, by using ion implantation and diffusion techniques, a contact layer 24 and a guard ring 25 are formed. The use of the fusing technique keeps the crystalline structure of both the compound semiconductor and Si intact, so a high quality light receiving device can be obtained.

In the structure described above, however, the Si multiplication layer is directly fused at elevated temperatures to the InGaAs layer of a low carrier concentration that absorbs optical signal. Normally, on an interface of a junction between the InGaAs layer and the Si multiplication layer, there are many impurities including oxides. These impurities infiltrate into the InGaAs layer near the junction during the fusing process. As a result, the carrier concentration in the InGaAs layer near the junction increases, resulting in a high electric field being applied. The InGaAs layer has a narrow bandgap, so that when it is applied a high electric field, a dark current increases, degrading the sensitivity down to a level not suitable for practical use. In fact, in a device which has a Si multiplication layer directly fused to an InGaAs layer, the dark current exceeds a microampere, making the sensitivity of the device three or more orders of magnitude worse than those of conventional avalanche photodiodes in practical use. Further, a high electric field gives rise to a problem of causing an avalanche breakdown even in the InGaAs layer and thus degrading a high-speed response.

An object of the present invention is to provide an avalanche photodiode having a low dark current, a high sensitivity and a high speed and made of a combination of a compound semiconductor and Si, and to provide a method of manufacturing the same.

SUMMARY OF THE INVENTION

The avalanche photodiode of this invention has a structure in which, in an interface between a compound semiconductor that absorbs an optical signal (referred to as an absorption layer) and a Si multiplication layer, at least one crystal layer formed of a composition or material different from that of the absorption layer and having a larger bandgap than that of the absorption layer (referred to as an interface layer) is formed.

Other objects, features and advantages of the invention will become apparent from the following description of the embodiments of the invention taken in conjunction with the accompanying drawings.

BRIEF DESCRIPTION OF THE DRAWINGS

FIGS. 5A to 5I are explanatory diagrams showing a process of fabricating a semiconductor light receiving device of the third embodiment of the present invention.

DETAILED DESCRIPTION OF THE EMBODIMENTS

Embodiment 1

Figure 1:
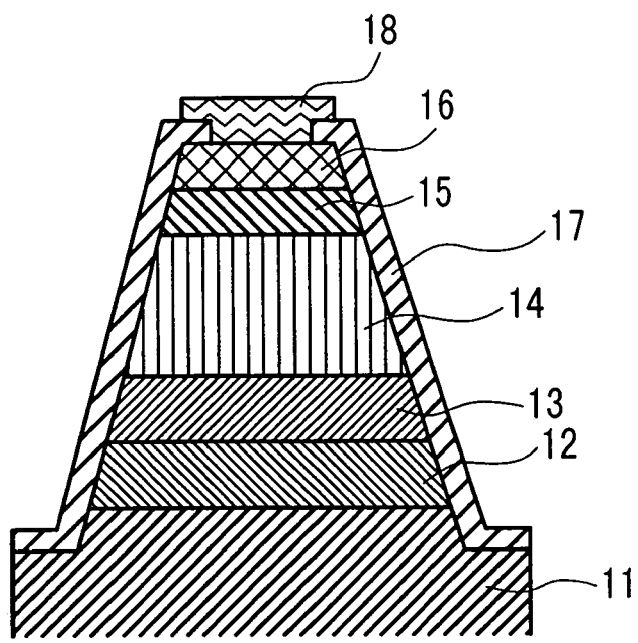
FIG. 1 is a cross-sectional view of a semiconductor light receiving device as a first embodiment of the present invention.
Figure 2:
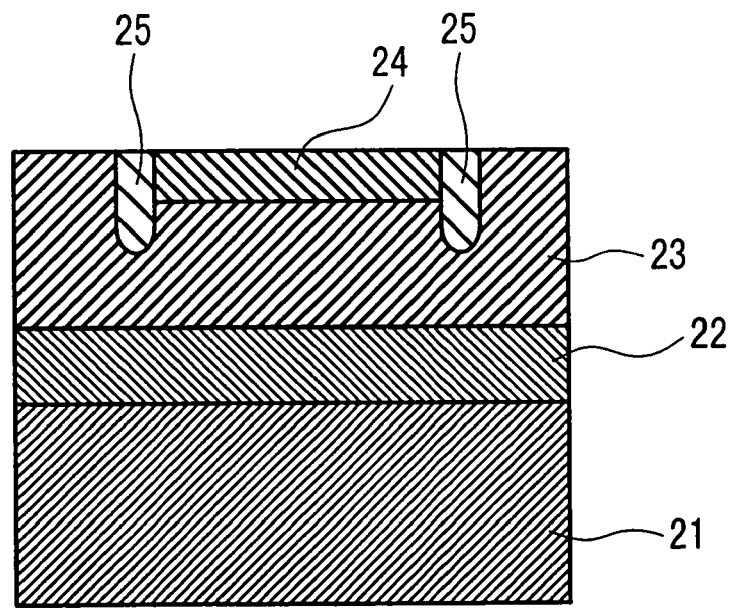
FIG. 2 is a cross-sectional view of a semiconductor light receiving device as a conventional example.

FIG. 1 illustrates an example structure of the avalanche photodiode of this invention. Denoted 11 is a Si substrate (n-type, $2 \times E18$ cm$^{-3}$), 12 a Si multiplication layer (n-type, 1E15 cm$^{-3}$, 0.2 μm), 13 an InAlAs interface layer (p-type, 1E18 cm$^{-3}$, 0.05 μm), 14 an InGaAs absorption layer (p-type, 2E15 cm$^{-3}$, 1.2 μm), 15 an InAlAs capping layer (p-type, 2E18 cm$^{-3}$, 1 μm), and 16 an InGaAs contact layer (p-type, 5E19 cm$^{-3}$, 0.1 μm) Reference number 17 represents a SiN film protecting the surface of the device. Reference number 18 is a metal electrode. The structure of the device shown is of a surface illuminated type, and an optical signal enters from a surface of the Si substrate 11 or the contact layer 16. The light receiving surface may be provided with a non-reflective coat film or an appropriate window structure or lens to enhance the optical signal receiving efficiency.

Embodiment 2

Figure 3:
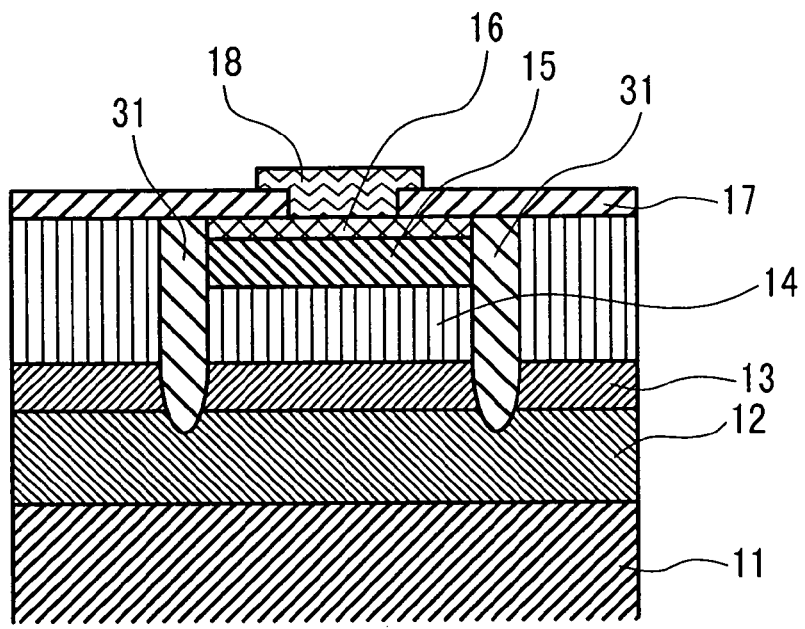
FIG. 3 is a cross-sectional view of a semiconductor light receiving device as a second embodiment of the present invention.

FIG. 3 illustrates another embodiment of this invention. In this embodiment, the device has a planar structure for improved reliability. Denoted 31 is a guard ring and a p-type impurity is doped through ion implantation or diffusion.

Embodiment 3

Figure 4:
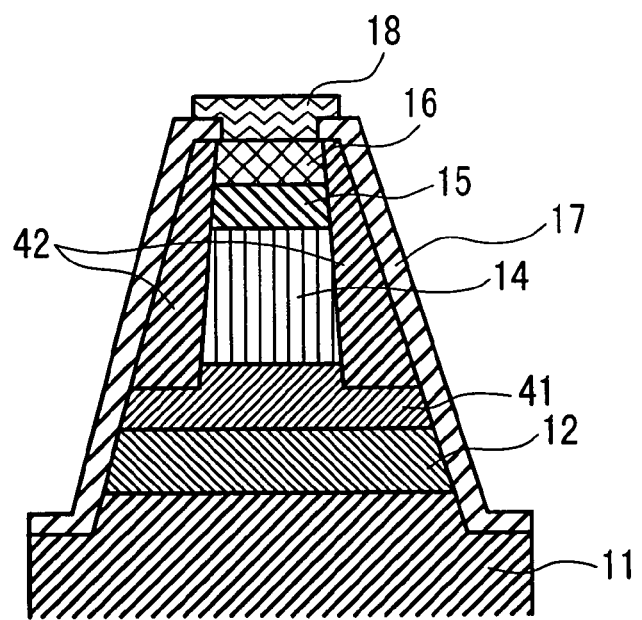
FIG. 4 is a cross-sectional view of a semiconductor light receiving device as a third embodiment of the present invention.

FIG. 4 illustrates still another embodiment of this invention. In this embodiment the basic structure of the element is similar to that of FIG. 1 except that a guard ring is provided for improved reliability. Designated 41 is an InGaAlAs interface layer (p-type, 1E18 cm$^{-3}$, 0.05 μm). The composition of InGaAlAs is adjusted so that the interface layer has a bandgap wavelength of 1.1 μm (equivalent to 1.13 eV) to prevent an optical signal of a 1.3-μm band from being absorbed. Denoted 42 is a guard ring formed of high-resistance InP. The guard ring may be p- or n-type InP if the carrier concentration is low.

A process of manufacturing this structure will be explained by referring to FIGS. 5A to 5I. First, a compound semiconductor and Si to be joined together are prepared separately. As shown in FIG. 5A, a highly resistive Si multiplication layer 52 with a low carrier concentration is epitaxially grown on an n-type Si substrate 51 through an appropriate method. Alternatively, an n-type impurity may be diffused into a highly resistive Si substrate to form the same structure. It is also possible to diffuse a p-type impurity into an n-type Si substrate to increase the resistance of the surface and thereby form the same structure. Next, as shown in FIG. 5B, this structure is formed into a trapezoidal shape (mesa) as by photolithography and dry or wet etching. The dimensions of the mesa structure need to be set to produce a proper capacity for high frequency use. In this embodiment, the mesa structure is shaped like a truncated cone which at its top measures about 25 μm in diameter for use in a 10 GHz range. Then, a dielectric film 53 of SiN or SiO$_2$ is formed over the surface by a proper chemical vapor deposition method to protect the surface. In the case of SiO$_2$, the dielectric film may be formed by a thermal oxidation method. Next, as shown in FIG. 5C, only the top portion of the dielectric film is removed by photolithography and dry or wet etching to expose the surface 54 of Si. Now, the preparation of Si is complete.

The compound semiconductor is prepared as follows. First, as shown in FIG. 5D, a p-type InGaAs contact layer 56 (with a carrier concentration of 5E19 cm$^{-3}$ and a thickness of 0.1 μm), a p-type InGaAlAs capping layer 57 (2E18 cm$^{-3}$, 1 μm), a p-type InGaAs absorption layer 58 (1E15 cm$^{-3}$, 1 μm) and a p-type InGaAlAs interface layer 59 (1E18 cm$^{-3}$, 0.05 μm) are epitaxially grown in that order over the InP substrate 55 by a molecular beam epitaxy. These layers are adjusted in their composition so as to have a lattice match with the InP substrate, and are also doped with Be, a p-type impurity, to control their carrier concentrations.

Figure 6:
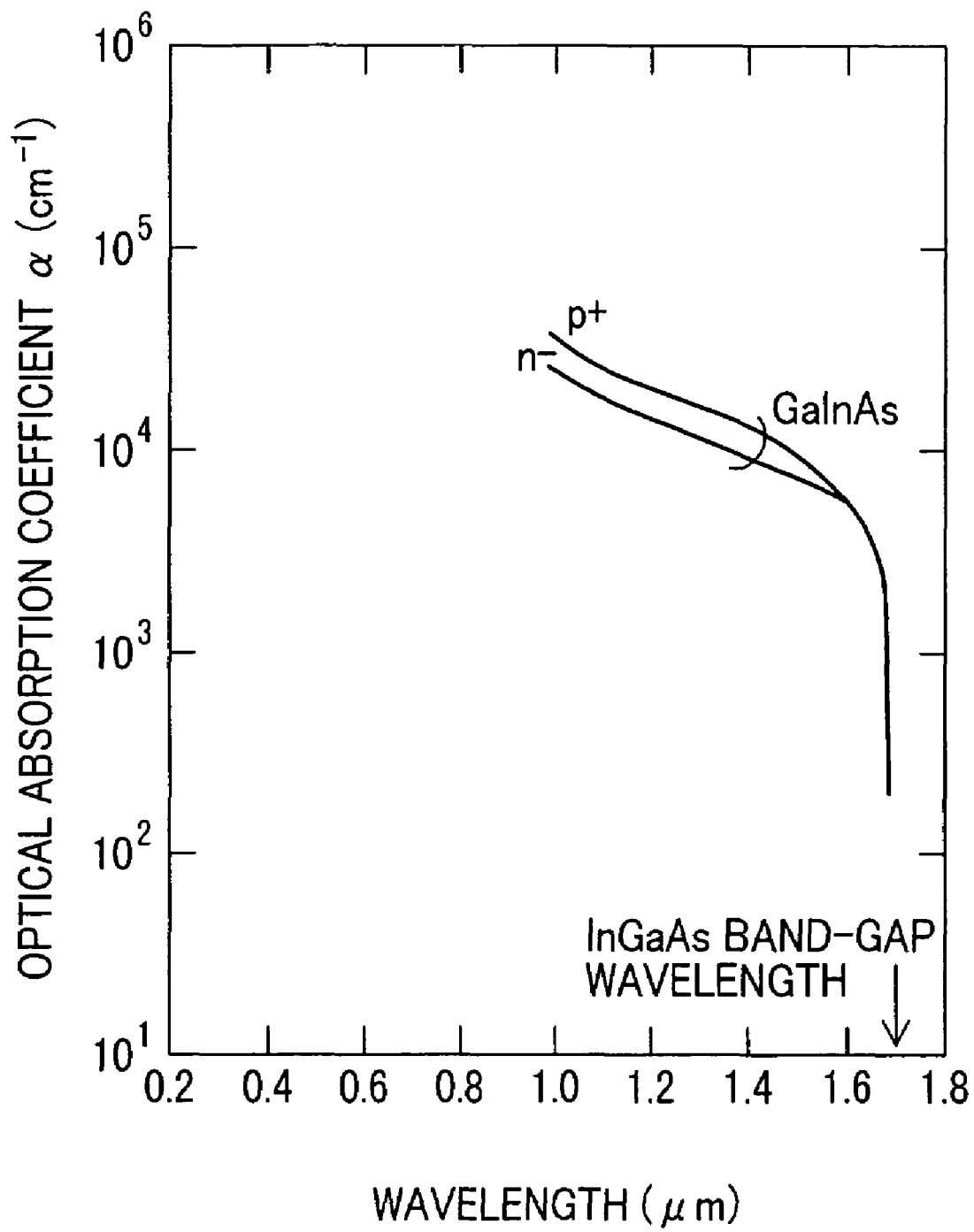
FIG. 6 is a graph showing a wavelength dependency of an absorption coefficient of InGaAs.

The composition of InGaAlAs used in the cap and interface layers is adjusted so that its bandgap will be 1.1 μm. This adjustment is made to ensure that the device does not absorb light of a 1.3-μm band, which represents an optical signal. FIG. 6 shows a relation between an optical absorption coefficient and a wavelength of light for InGaAs. It can be seen from this graph that InGaAs absorbs almost no light when the optical wavelength is about 0.1 μm longer than its bandgap wavelength. Thus, if the bandgap wavelength is set shorter than 1.2 μm, InGaAlAs used in the cap and interface layers no longer absorbs a 1.3-μm band optical signal, thus avoiding an unwanted loss of the optical signal. That is, the composition of InGaAlAs used in the cap and interface layers need only have a bandgap wavelength shorter than 1.2 μm, and its bandgap wavelength is not limited to 1.1 μm.

However, InGaAlAs used in the cap and interface layers also has a limit value on a shorter wavelength side of the bandgap wavelength, which is restricted by a difference in bandgap between it and the InGaAs absorption layer. That is, when the difference in bandgap between InGaAlAs used in the cap and interface layers and the InGaAs absorption layer becomes too large, the electrons and holes cannot ride over the energy difference at the interface and build up there, resulting in a loss of a high-speed response, a so-called pileup phenomenon. Thus, the bandgap of InGaAlAs used in the cap and interface layers must not be set excessively large. Normally, to obtain a 10-GHz response speed, the energy difference in a conduction or valence band between the bandgap of InGaAlAs used in the cap and interface layers and the bandgap of the InGaAs absorption layer needs to be set to about 0.5 eV. Based on this, the limit value on the shorter wave-length side of the bandgap wavelength of InGaAlAs used in the cap and interface layers is calculated to be approximately 700 nm.

These layers may be grown by a metalorganic vapor phase epitaxy or a proper chemical vapor deposition. The p-type dopant may be Zn. Next, this structure is processed by photolithography and dry or wet etching into a trapezoidal shape (mesa), as shown in FIG. 5E. A top of the truncated cone structure thus formed has a diameter of about 25 μm, as in FIG. 5B. Now, the preparation of the compound semiconductor is complete.

Next, Si 510 of FIG. 5C and the compound semiconductor 511 of FIG. 5E, prepared as described above, are joined as follows. As shown in FIG. 5F, Si of FIG. 5C and the compound semiconductor of FIG. 5E are arranged so that their top portions oppose each other and, in this condition, they are placed in a radio frequency plasma system. A small amount of argon gas is introduced into a chamber of the system to clean the surfaces of the structures to be joined. Immediately after cleaning, the top portions are brought into contact to join Si of FIG. 5C and the compound semiconductor of FIG. 5E. This joining may be done by heating though it can be performed at an ordinary temperature. Then, the joined structure is immersed in a weak hydrochloric acid-based etching liquid to selectively remove unwanted InP substrate. Then, as shown in FIG. 5G, the combined structure is subjected to the photolithography and dry or wet etching to process only the compound semiconductor into a trapezoidal shape again. After this, as shown in FIG. 5H, a dielectric mask 512 is formed by photolithography and dry or wet etching. This is followed by a highly resistive InP layer 513 being grown by a metalorganic vapor phase epitaxy or a proper chemical vapor deposition. Then, as shown in FIG. 5I, the dielectric mask is removed, after which a SiN film 514 for the protection of the entire device is formed by the plasma chemical vapor deposition and a hole for electrode connection is formed in the SiN film by photolithography. Then, a metal electrode 515 is formed by vapor deposition, photolithography and liftoff process. In the last step, a non-reflective coat 516 is formed over the Si substrate surface which constitutes a light incident surface. Now, the light receiving device is complete.

When a reverse bias was applied to the device fabricated in this manner, a breakdown voltage Vb was 35 V and a dark current at 32 V, about 90% of the breakdown voltage, was as low as 50 nA. As for the high frequency characteristic, a multiplication factor of 10-GHz optical signal was 25 at maximum and uniform within a light receiving range. Further, in a reverse bias conduction test at an elevated temperature (200° C., 100 μA constant), a voltage variation after 1000 hours was less than 1 V, and a breakdown voltage and a dark current at room temperature showed no change from those before the test.

Embodiment 4

Figure 7:
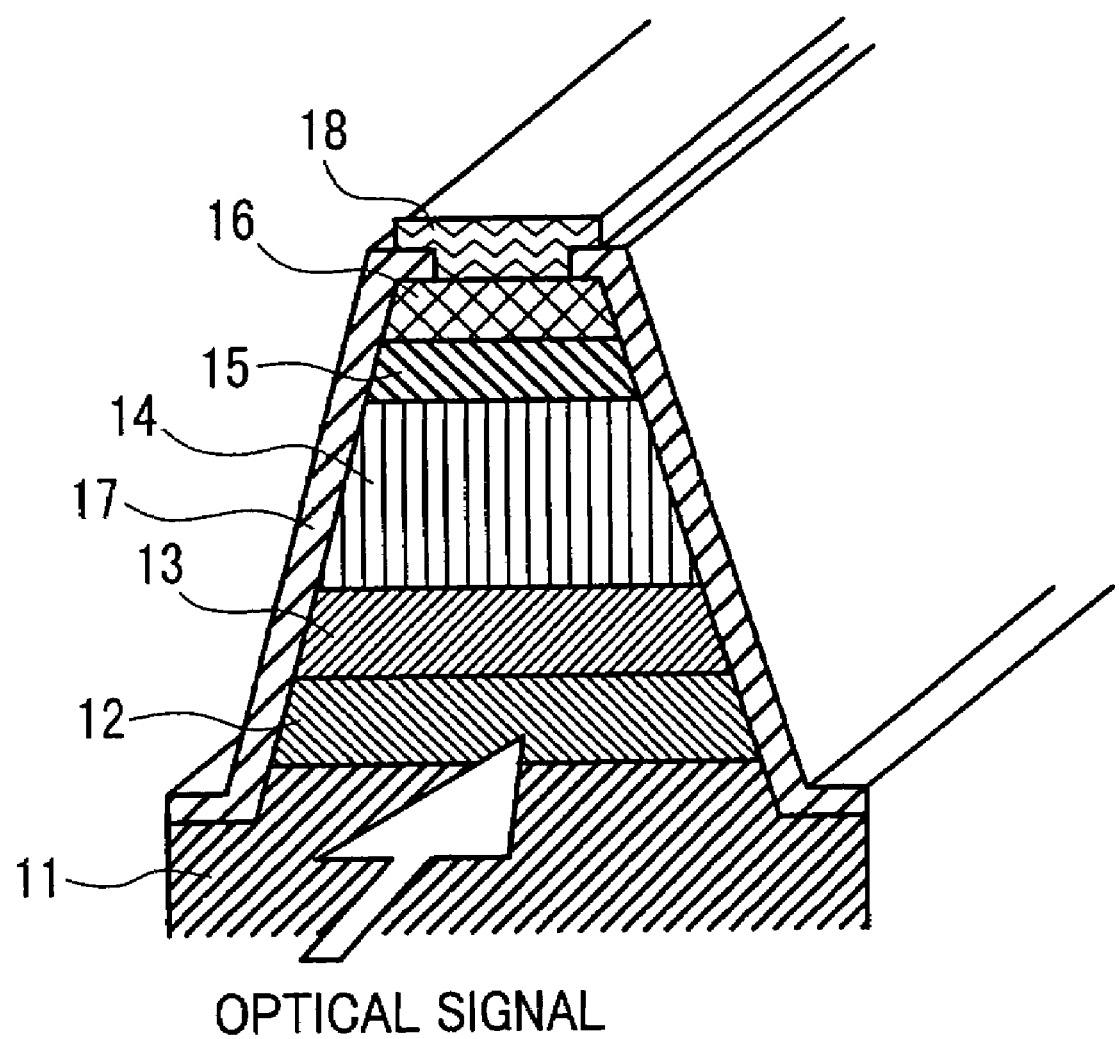
FIG. 7 is a cross-sectional view of a semiconductor light receiving device as a fourth embodiment of the present invention.

FIG. 7 shows yet another embodiment of this invention. The device of this embodiment has a structure similar in cross section to that of Embodiment 1 of FIG. 1, except that it is shaped like a waveguide. In FIG. 7, parts identical with those of FIG. 1 are given like reference numbers. While in Embodiment 1 an optical signal strikes the substrate at right angles or at angles close to 90 degrees to it, this embodiment has the optical signal enter the substrate parallel or nearly parallel to it. This device has a high speed and sensitivity of 40 GHz or higher and is suited for surface mounting.

Embodiment 5

Figure 8:
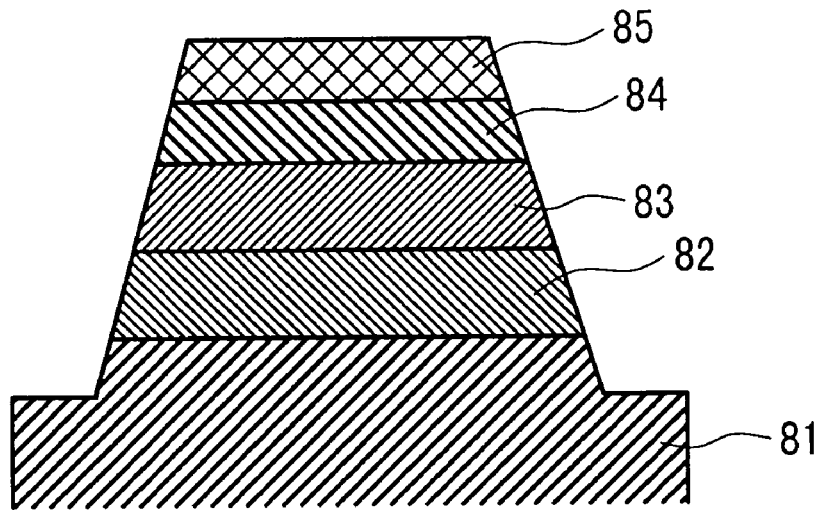
FIG. 8 is a cross-sectional view of a semiconductor light receiving device as a fifth embodiment of the present invention.

FIG. 8 shows a further embodiment of this invention. The device of this embodiment has a surface illuminated type structure similar to that of Embodiment 1, except that a compound semiconductor substrate is used as a base on which a Si multiplication layer is formed. Denoted 81 is an InP substrate (n-type, 2×E18 cm$^{-3}$), 82 an InGaAs optical absorption layer (n-type, 2E15 cm$^{-3}$, 1.2 μm), 83 an InGaAsP interface layer (n-type, 1E18 cm$^{-3}$, 0.05 μm), 84 a Si multiplication layer (p-type, 1E15 cm$^{-3}$, 0.2 μm), and 85 a Si contact layer (p-type, 2E18 cm$^{-3}$, 0.1 μm). The composition of InGaAsP is adjusted for the same reason as Embodiment 3 so that it has a bandgap wavelength of 1.1 μm to prevent an optical signal of a 1.3-μm band from being absorbed.

Embodiment 6

Figure 9:
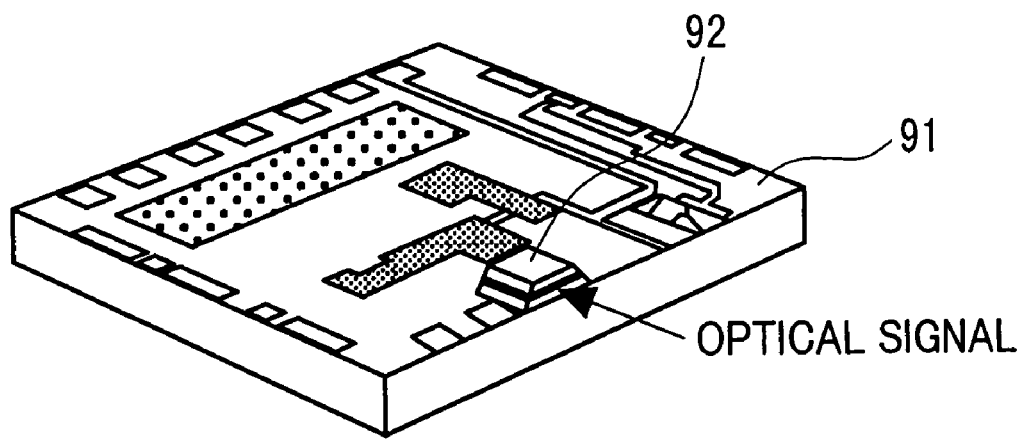
FIG. 9 is a cross-sectional view of a semiconductor light receiving device as a sixth embodiment of the present invention.

FIG. 9 shows a further embodiment of this invention. Instead of a simple Si substrate, the device of this embodiment uses a substrate formed with a Si or SiGe integrated circuit and has an avalanche photodiode similar to Embodiment 4 formed on that substrate. Denoted 91 is a preamplifier made of a Si or SiGe integrated circuit on a Si substrate, and 92 an avalanche photodiode of FIG. 7. It is noted that a single substrate is commonly used as the Si substrate 11 and the integrated circuit Si substrate 91.

Embodiment 7

Figure 10:
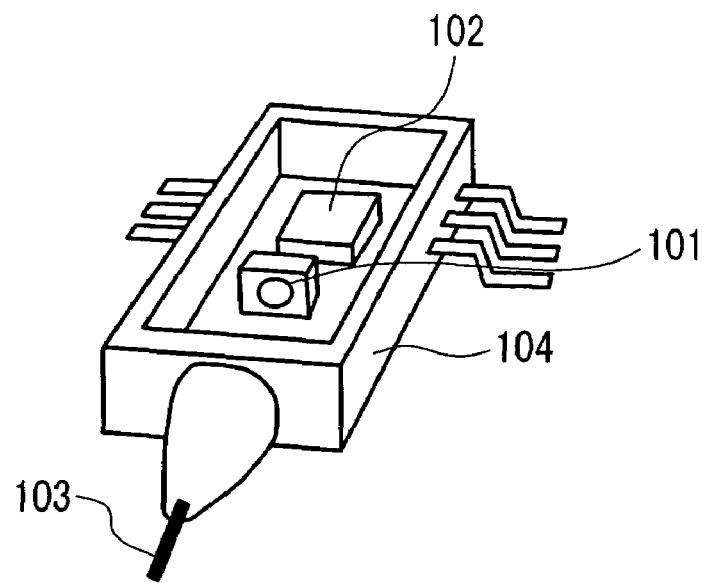
FIG. 10 is a cross-sectional view of a semiconductor light receiving device as a seventh embodiment of the present invention.

FIG. 10 shows a further embodiment of this invention. This embodiment represents an example optical module having the avalanche photodiode 101 of FIG. 4, a preamplifier integrated circuit device 102 and an optical fiber 103 all accommodated in a single case 104.

Embodiment 8

Figure 11:
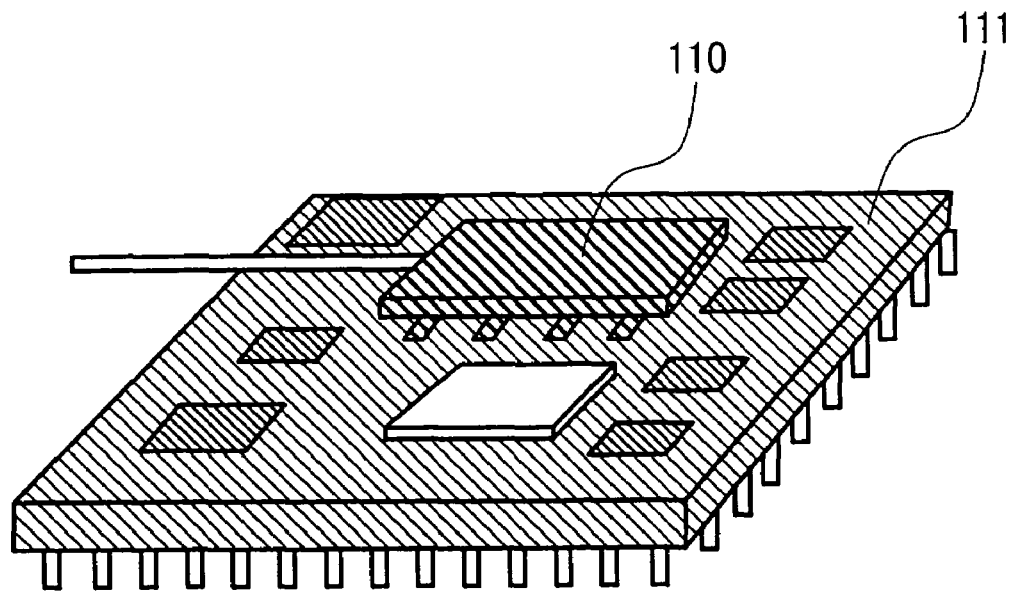
FIG. 11 is a cross-sectional view of a semiconductor light receiving device as a eighth embodiment of the present invention.

FIG. 11 shows a further embodiment of this invention. This embodiment represents an example optical receiver having the optical module 110 of FIG. 10 mounted on a package 111 incorporating an analog-digital converter and a decoder.

With the embodiments of this invention, even if an electric field strength at an interface between Si and a compound semiconductor fused together becomes abnormally high due to an effect of impurities present at the interface, a large bandgap of the compound semiconductor material at the interface can minimize an increase in a dark current. By deliberately doping impurities in the interface layer to nullify electric influences of the interface impurities, it is possible to suppress electric field anomalies at the interface. As a result, a highly sensitive, fast avalanche photodiode for optical communications with a much lower dark current can be realized.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method of manufacturing an avalanche photodiode, comprising the steps of:
    (a) forming a silicon multiplication layer over a silicon substrate and providing a multiplication portion exposed on said multiplication layer;
    (b) forming an optical absorption layer composed of a compound semiconductor over said silicon substrate and providing an absorption portion forming a semiconductor interface layer over said optical absorption layer, wherein a band-gap of said interface layer is wider than that of said optical absorption layer, a band-gap of said optical absorption layer is narrower than that of said multiplication layer, and a p-type or n-type impurity is doped in said interface layer; and
    (c) fusing said multiplication layer to said multiplication portion such that the exposed multiplication layer is firmly fixed to said semiconductor interface layer.

2. The method according to claim 1, wherein said optical absorption layer is formed of an InGaAs mixed crystal or InGaAlAs mixed crystal or InGaAsP mixed crystal, and said semiconductor interface layer is formed of said InGaAlAs mixed crystal or InGaAsP mixed crystal.

3. The method according to claim 1, wherein said optical absorption layer is formed of an InGaAs mixed crystal or InGaAlAs mixed crystal or InGaAsP mixed crystal, and said semiconductor interface layer is formed of InP or GaAs.

4. The method according to claim 1, wherein said optical absorption layer is formed of a semiconductor containing Sb.

5. The method according to claim 1, wherein a junction between said silicon multiplication layer and said semiconductor interface layer is formed by the fusion.

* * * * *